(12) United States Patent
Ji

(10) Patent No.: US 7,012,485 B2
(45) Date of Patent: Mar. 14, 2006

(54) MINIATURE WIDEBAND RF CHOKE

(75) Inventor: Daxiong Ji, Brooklyn, NY (US)

(73) Assignee: Scientific Components Corporation, Brooklyn, NY (US)

( * ) Notice: Subject to any disclaimer, the term of this patent is extended or adjusted under 35 U.S.C. 154(b) by 65 days.

(21) Appl. No.: 10/884,508

(22) Filed: Jul. 6, 2004

(65) Prior Publication Data

US 2006/0006963 A1    Jan. 12, 2006

(51) Int. Cl.
*H03H 7/01* (2006.01)
*H01H 5/02* (2006.01)

(52) U.S. Cl. .................. 333/181; 333/185; 336/200

(58) Field of Classification Search .................. 333/12, 333/181, 185; 336/200, 232, 205, 244
See application file for complete search history.

(56) References Cited

U.S. PATENT DOCUMENTS 5,414,402 A * 5/1995 Mandai et al. .............. 336/200
6,937,454 B1 * 8/2005 Mikolajczak et al. ....... 361/111

* cited by examiner

*Primary Examiner*—Seungsook Ham
(74) *Attorney, Agent, or Firm*—Kevin Redmond

(57) ABSTRACT

A miniature wideband RF choke has a low temperature co-fired ceramic substrate with a top surface and a bottom surface. A first inductor is located within the substrate. Terminals are located on the top and bottom surfaces. A second inductor is located on the top surface. The second inductor has a core wound with a wire. Vias extend through the substrate connecting the terminals to the inductors.

22 Claims, 7 Drawing Sheets

MINIATURE WIDEBAND RF CHOKE

BACKGROUND

1. Field of the Invention

This invention relates to radio frequency (RF) chokes used with radio frequency and microwave frequency signals in general and more particularly to a miniature wideband RF choke that has a small package size and that can be manufactured at low cost.

2. Description of the Related Art

RF chokes are used in various devices. The RF choke separates an RF signal from a DC signal or a single-phase AC signal by presenting a low impedance to the DC or low frequency (60 Hz) AC signal. At the same time, the RF choke presents a high impedance to a RF signal, which typically has a frequency range of 5 to 1000 MHz. The DC or low frequency AC signal is shunted through the RF choke, while the RF signal is blocked. A perfect RF choke would pass all of the DC or low frequency AC signal through the RF choke while blocking all of the RF signal.

Referring to FIG. 1, a schematic diagram of an RF choke 20 is shown. RF choke 20 has an input port IN and an output port OUT. Inductor L has one end connected to input port IN and another end connected to output port OUT. The inductor can be a wire wound on a ferrite core. The parasitic capacitance of the inductor is shown as capacitor C. The loss of the ferrite core and the resistance of the wire are shown as resistor R. For good performance at low frequencies, the inductance should be large. Unfortunately, when the inductance is large, the parasitic capacitance is also large and the parasitic resistance low. The result is that the electrical performance of the RF choke is poor at high frequencies.

In order to increase the bandwidth performance of RF choke 20 over a larger frequency range, a second inductor in series can be added. Referring to FIG. 2, a schematic diagram of a wideband RF choke 30 is shown. Wideband RF choke 30 has an input port IN and an output port OUT. Inductor L1 has one end connected to input port IN and another end connected to node 32. Inductor L2 has one end connected to output port OUT and another end connected to node 32. The inductor L1 and L2 can be wires wound on ferrite cores. The parasitic capacitance of the inductors are shown as capacitors C1 and C2. The loss of the ferrite cores and the resistance of the wires are shown as resistors R1 and R2. Inductor L1 is selected to be large enough for proper low frequency operation. Inductor L2 is selected to be small for high frequency operation. Since inductor L2 has a small value, the parasitic capacitance C2 is small and the parasitic resistance R2 is high. Therefore RF choke 30 has good performance at both high and low frequencies.

Referring to FIG. 3, a prior art RF choke assembly or package 40 is shown. RF choke assembly 40 has a plastic housing 42 with a top surface 43 and a cavity 44. Six metal leads 46 are attached to top surface 43. A ferrite binocular core 48 and a ferrite single core 50 are mounted in cavity 44. Wire 52 has ends 52A and 52B. Wire 52 is wound on cores 48 and 50 and the ends attached to respective leads 46. Core 48 forms inductor L1 and core 50 forms inductor L2. RF choke assembly 40 has typical dimensions of 0.310 inches in length by 0.280 inches in width by 0.112 inches in height. RF choke 40 has an area of 0.0868 square inches. RF choke assembly or package 40 is typically soldered onto another printed circuit board.

Unfortunately, RF choke assembly or package 40 takes up excessive space when it is mounted on a printed circuit board. The mounting of the cores side by side results in a large package. The mounting of the cores and winding of the wire are manual operations that are difficult to automate. It is desirable, in order to reduce cost, to automate as much of the assembly process as possible.

While RF chokes have been used, they have suffered from being too large, expensive, difficult to assemble and not easily manufactured using automated equipment. A current unmet need exists for a wideband RF choke that has a smaller size, can be assembled at a low cost and that can be manufactured using automated equipment.

SUMMARY

It is a feature of the invention to provide a miniature wideband RF choke that has a small package size and that can be manufactured at low cost.

A further feature of the invention is to provide a radio frequency choke that includes a substrate having a top surface and a bottom surface. A first inductor is located within the substrate. The first inductor has a first and second end. A first and second top terminal are located on the top surface. A first and second bottom terminal are located on the bottom surface. A first via extends through the substrate between the first top terminal and the first bottom terminal. A second via extends through the substrate between the second top terminal and the first end of the first inductor. A third via extends through the substrate between the second bottom terminal and the second end of the first inductor. A second inductor is attached to the top surface. The second inductor has a core and a wire wound on the core. The wire has a first end connected to the first top terminal and a second end connected to the second top terminal.

It is noted that the drawings of the invention are not to scale.

DETAILED DESCRIPTION

Figure 4:
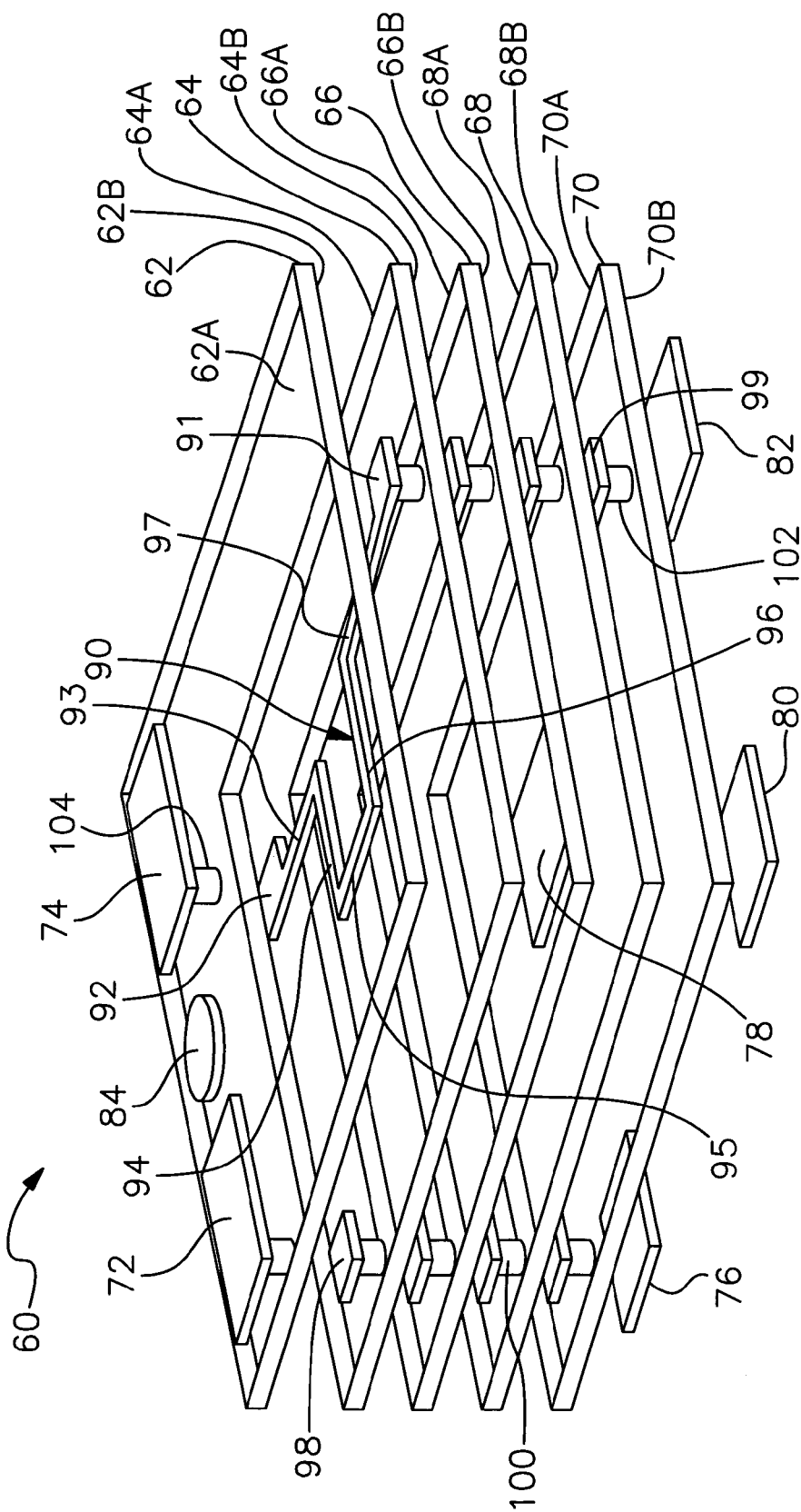
FIG. 4 is an exploded view of the substrate of the present invention.

Referring to FIG. 4, an exploded view of a low temperature co-fired ceramic (LTCC) substrate 60 is shown. Substrate 60 has a top surface 62A and a bottom surface 70B. LTCC substrate 60 is comprised of multiple layers of low temperature co-fired ceramic material. Planar layers 62, 64, 66, 68 and 70 are all stacked on top of each other and form a unitary structure 60 after firing in an oven. LTCC layers 62–70 are commercially available in the form of a green unfired tape from Dupont Corporation. Each of the layers has a top surface, 62A, 64A, 66A, 68A and 70A. Similarly, each of the layers has a bottom surface, 62B, 64B, 66B, 68B and 70B.

The layers have several circuit features that are patterned on the surfaces. Layer 62 has several circuit features that are patterned on surface 62A. Surface 62A has two terminals 72 and 74 and an orientation mark 84. The terminals are electrically connected to vias. Terminal 72 is connected to via 100 and terminal 74 is connected to via 104. The vias extend through some of the layers. The vias are formed from an electrically conductive material and electrically connect one layer to another layer.

Layer 64 has a conductor line 90 located on surface 64A. Conductor line 90 has a wide end 91, another wide end 92 and thin joined segments 93, 94, 95, 96 and 97. Conductor line 90 is U-shaped. Wide end 91 is connected to via 102. Wide end 92 is connected to via 104. Conductor line 90 has an associated inductance and forms inductor L2 in the electrical schematic of FIG. 2. Conductor line 90 is therefore sandwiched between layers 62 and 64. Conductor line 90 can have typical dimensions of 0.16 inches in length, 0.004 inches in width and 0.0005 inches in thickness.

A via pad 98 is located on surfaces 64A, 66A, 68A and 70A. Via pad 98 is connected to via 100 and helps to make a more reliable electrical connection between the layers. Similarly, via pads 99 are connected to via 102.

Layer 70 has several circuit features that are patterned on surface 70B. Surface 70B has four terminals 76, 78, 80 and 82. Terminal 76 is connected to via 100 and terminal 82 is connected to via 102.

The circuit features and vias of substrate 60 are formed by screen printing conventional thick film conductor and via materials on the low temperature ceramic layers. The layers are then stacked onto each other and fired in an oven to produce a unitary part.

Figure 1:
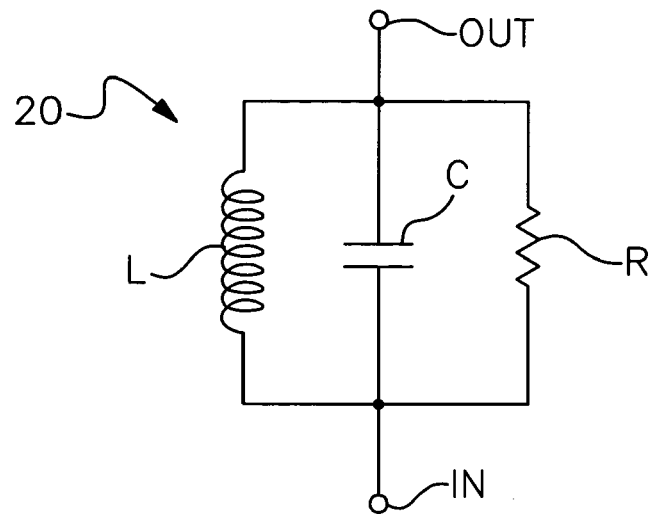
FIG. 1 is an electrical schematic diagram of an RF Choke.
Figure 2:
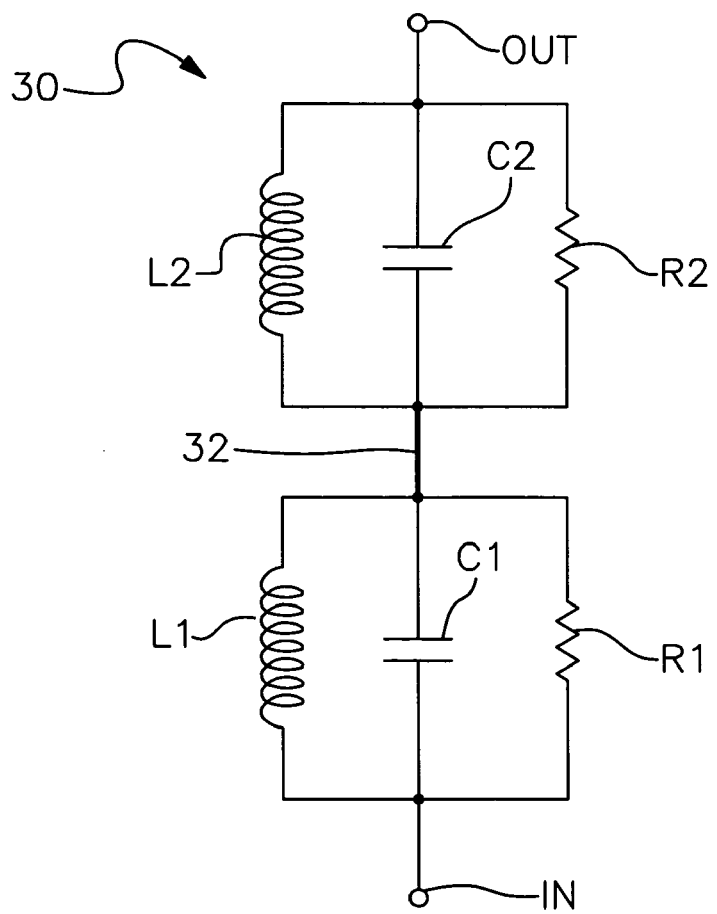
FIG. 2 is an electrical schematic diagram of a wideband RF Choke.
Figure 3:
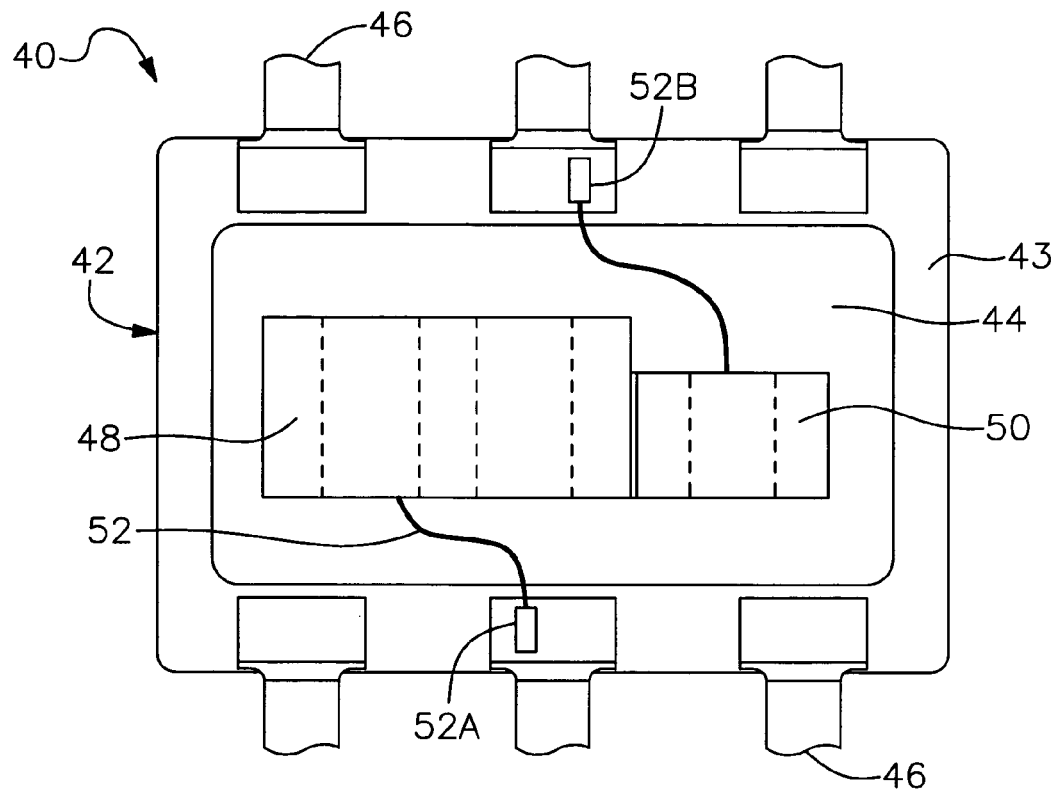
FIG. 3 is a top view of a prior art RF choke package.
Figure 5:
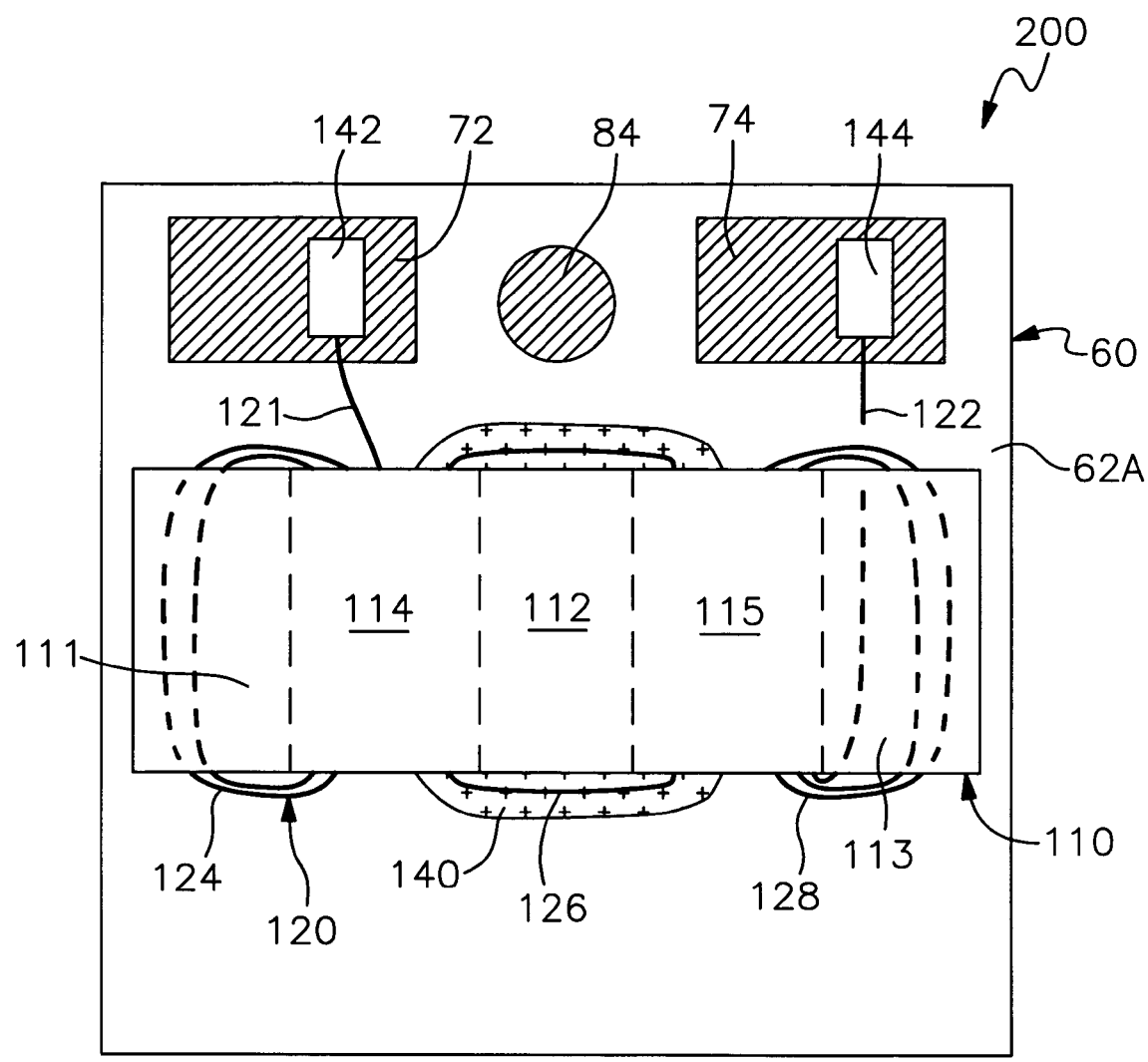
FIG. 5 is a top view of a miniature wideband RF choke in accordance with the present invention.
Figure 6:
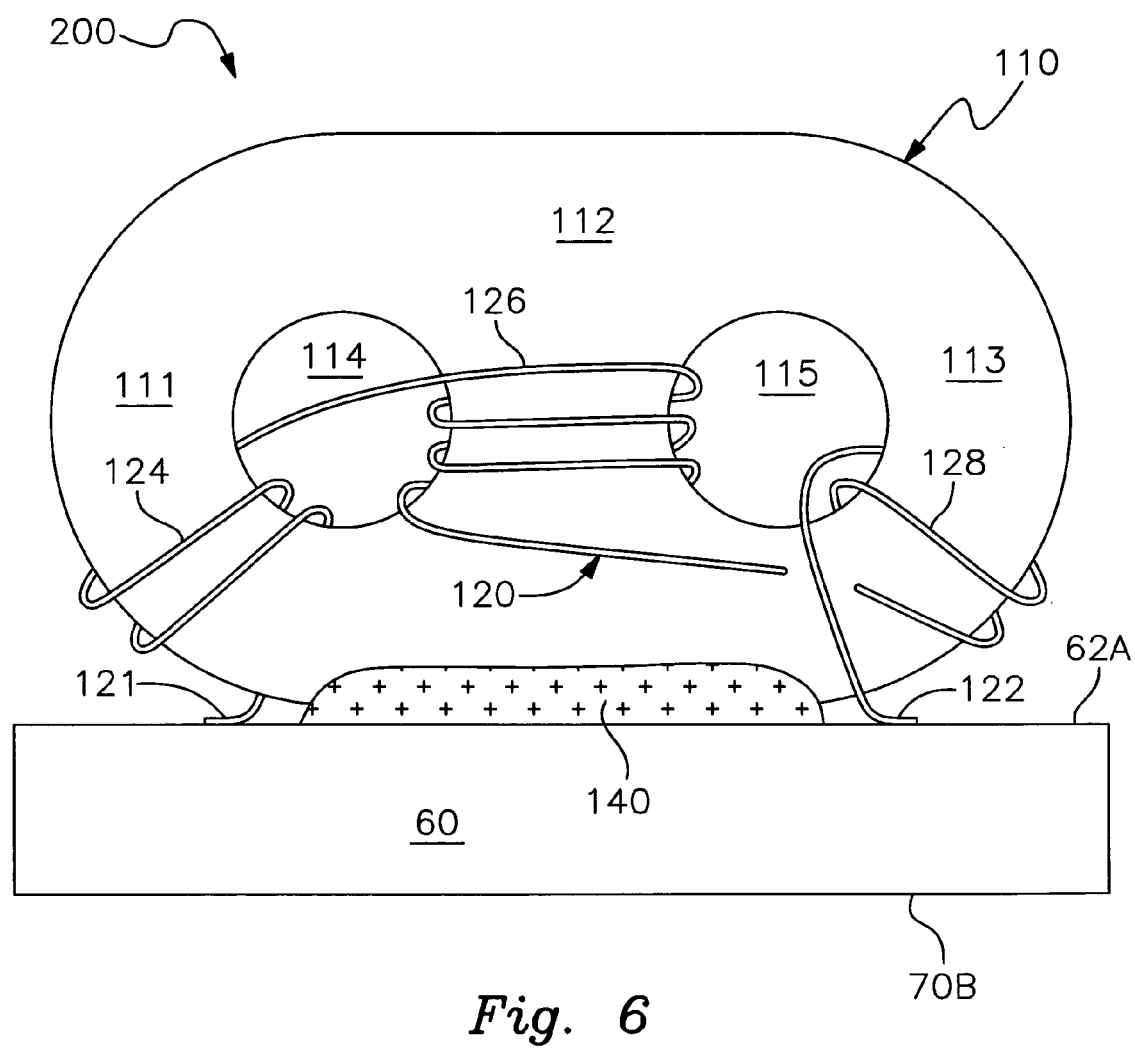
FIG. 6 is a side view of FIG. 5.

Referring to FIGS. 5 and 6, the electrical schematic of the wideband RF choke of FIG. 2 is realized in a physical package. Miniature wideband RF choke or choke assembly 200 has a binocular core 110 mounted to top surface 62A. Core 110 is mounted to surface 62A by an adhesive 140. Adhesive 140 can be an epoxy or other suitable glue. Core 110 is a ferrite binocular core with three legs 111, 112 and 113. Leg 112 is the center leg. Core 110 has apertures 114 and 115.

A wire 120 is wound on core 110. Wire 120 has ends 121 and 122. Wire 120 is wound for 2 turns on leg 111 to form a winding 124. Wire 120 is wound for 3 turns on center leg 112 to form a winding 126. Wire 120 is wound for 2 turns on leg 113 to form a winding 128. The wire ends are attached to terminals 72 and 74 by welds. Wire end 121 is attached to terminal 72 by weld 142. Wire end 122 is attached to terminal 74 by weld 144. Wire 120 can be 36-gauge magnet wire.

Core 110 and wire 120 has an associated inductance and forms inductor L1 of the electrical schematic of FIG. 2.

RF choke 200 has an overall size of 0.15 inches in length, 0.15 inches in width and 0.15 inches in height. RF choke 200 can be smaller than these dimensions. RF choke 200 has an area of 0.0225 square inches.

RF choke 200 would typically be mounted to a printed circuit board (not shown). The terminals 76, 78, 80 and 82 would be attached to the printed circuit board using a reflowed solder paste. Solder paste would be screen printed onto the printed circuit board. Terminals 76, 78, 80 and 82 would be placed onto the solder paste and melted in a re-flow oven to attach the RF choke to the printed circuit board.

RF choke 200 can be assembled in the following manner:
1. Core 110 is wound with wire 120 to form inductor L1.
2. Adhesive 140 is dispensed onto top surface 62A.
3. Core 110 with windings is placed onto adhesive 140 and cured.
4. Wire ends 121 and 122 are welded to terminals 72 and 74.
5. The completed assembly is electrically tested.

The present invention has several advantages. Since, inductor L2 or conductor line 90 is integrated into the low temperature co-fired ceramic substrate, it is not mounted separately adjacent to inductor L1 or core 110. This creates a smaller overall package size.

The use of the integrated inductor reduces the number of assembly steps for the RF choke resulting a lower cost of assembly.

By placing inductor L2 within substrate 60, the remaining manufacturing steps can be done using automated equipment. Automated assembly reduces the cost of manufacturing.

Fabricating the RF choke using a low temperature co-fired ceramic substrate results in more uniform electrical characteristics.

A RF choke in accordance with the present invention was built and tested for electrical performance. Inductor L1 had an inductance value of 4 micro-henries at 0 milli-amps of current and 0.95 micro-henries at 100 milli-amps (DC) of current. Inductor L2 had an inductance value of 6 nano-henries.

Figure 9:
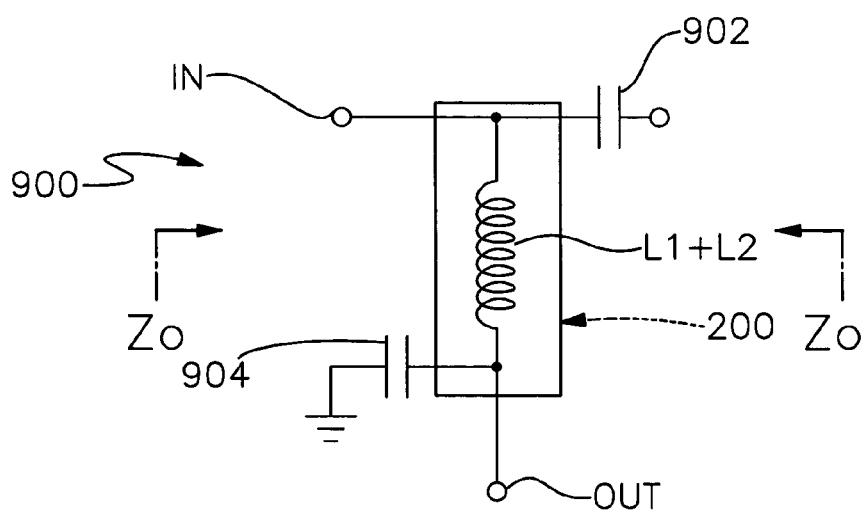
FIG. 9 is an electrical schematic diagram of a test circuit for an RF choke.

FIG. 9 shows an electrical schematic diagram of a test circuit 900 that was used to test RF choke 200. Test circuit 900 has RF choke 200 connected with a pair of capacitors 902 and 904. Capacitor 902 is connected between the input port IN and a RF output port RF out. Capacitor 904 is connected between the output port OUT and ground.

Figure 7:
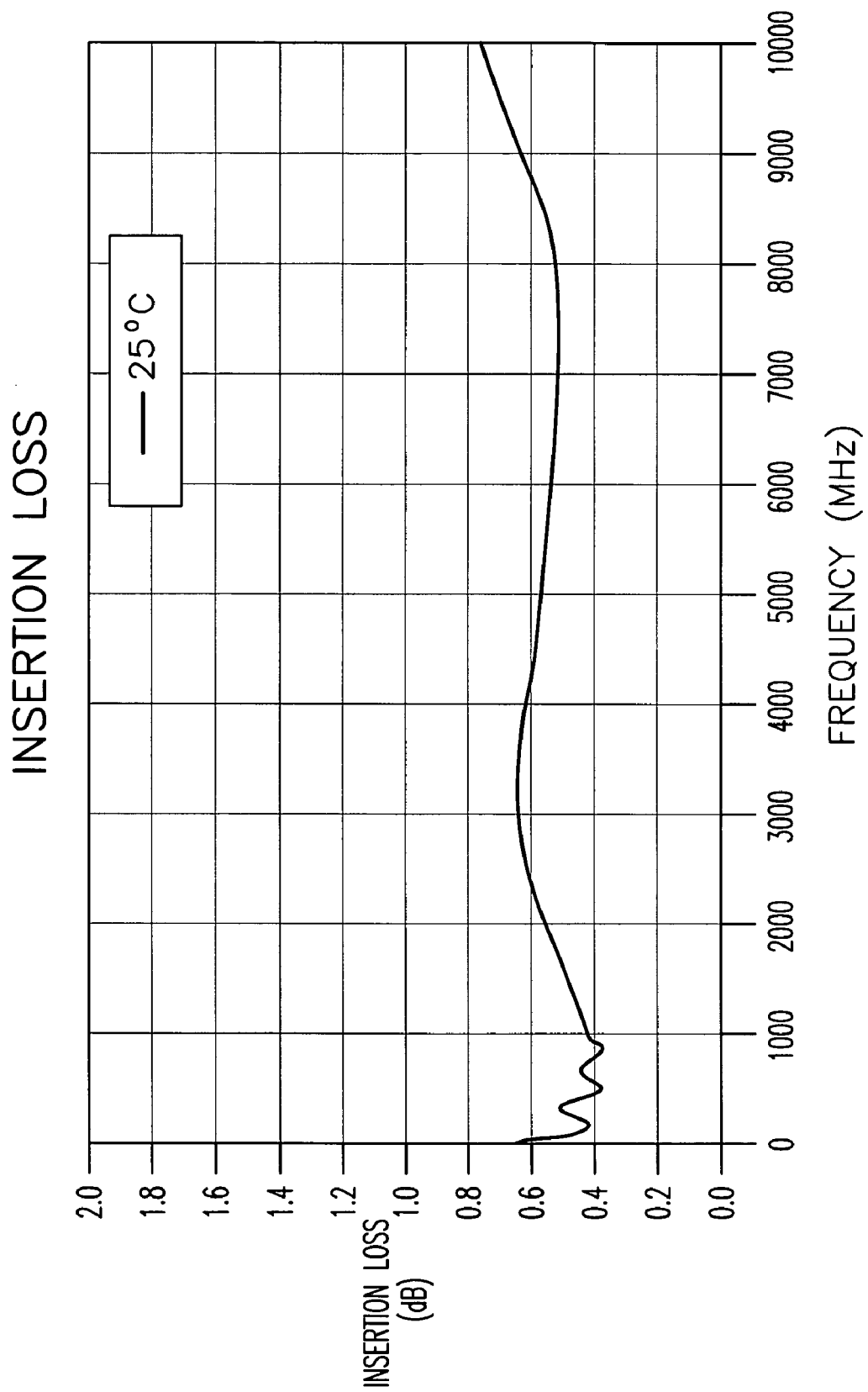
FIG. 7 is a graph showing insertion loss versus frequency for the RF choke of FIG. 5.
Figure 8:
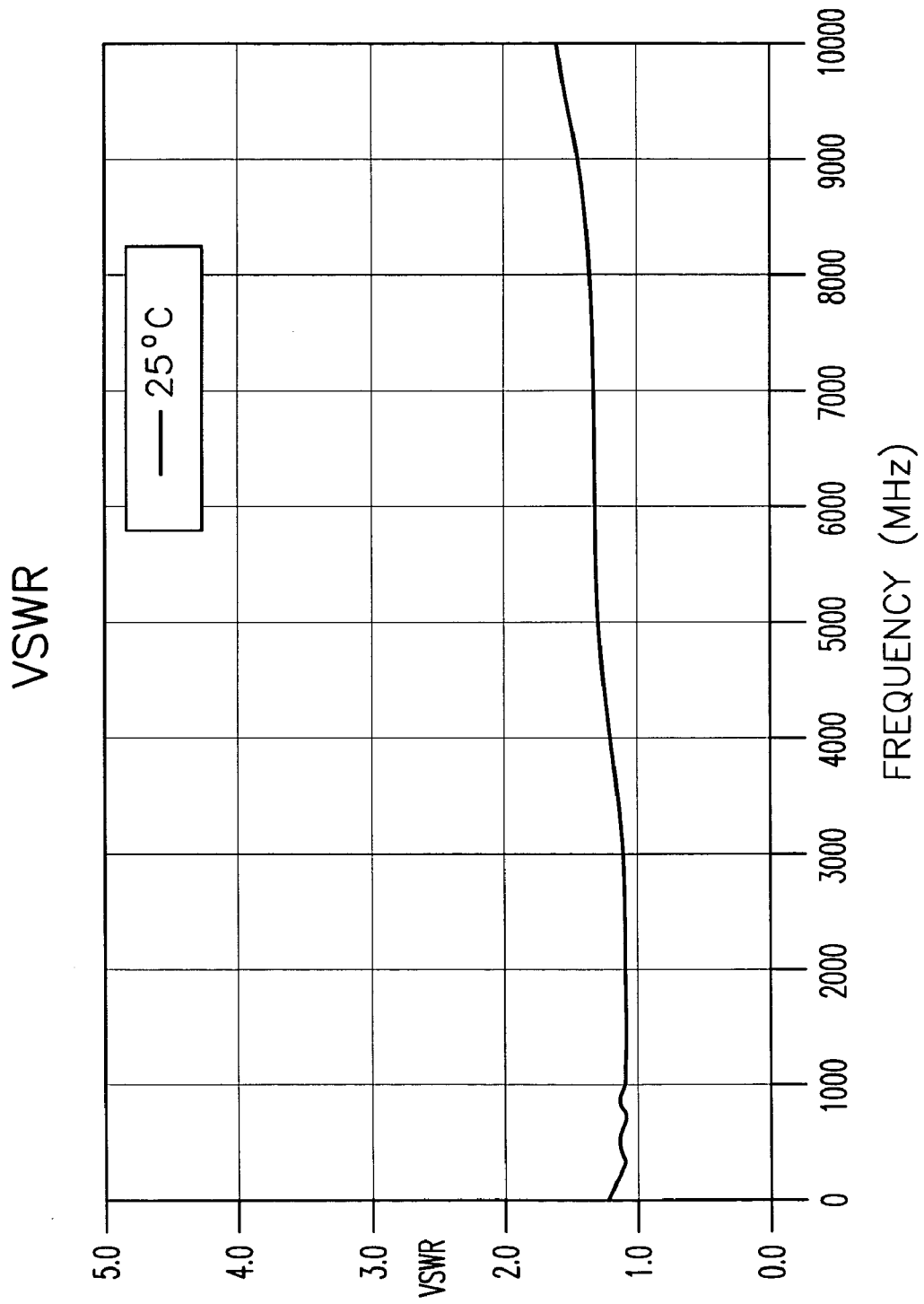
FIG. 8 is a graph showing VSWR versus frequency for the RF choke of FIG. 5.

Referring to FIG. 7, a graph showing the insertion loss for wideband RF choke 200 is shown over the frequency range of from 30 to 10,000 MHz. The insertion loss was typically 0.5 dB with a maximum of 1.1 dB. FIG. 8 shows a graph of VSWR versus frequency for wideband RF choke 200. The VSWR was typically 1.1 with a maximum of 1.6.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the description. All changes that come within the meaning and range of equivalency of the claims are to be embraced within their scope.

What is claimed is:

1. An RF choke comprising:
   a) a substrate having a top layer, a bottom layer, and a plurality of inner layers;
   b) a conductor line formed on an inner layer, the conductor line having a first and second end;
   c) first terminal and second terminal located on the top layer;
   d) third terminal and fourth terminal located on the bottom layer;
   e) a first via extending through the substrate between the first terminal and the third terminal;
   f) a second via extending through the substrate between the second terminal and the first end of the conductor line;
   g) a third via extending through the substrate between the fourth terminal and the second end of the conductor line;
   h) a core attached to the top layer; and i) a wire having a first end and a second end, the wire wound on the core, the first end connected to the first terminal and the second end connected to the second terminal.

2. The RF choke according to claim 1, wherein the substrate is formed from layers of low temperature co-fired ceramic.

3. The RF choke according to claim 1, wherein the third terminal forms an input port and the fourth terminal forms an output port.

4. The RF choke according to claim 1, wherein the core is a binocular core.

5. The RF choke according to claim 1 wherein the core is attached to the top layer by an adhesive.

6. The RF choke according to claim 1 wherein the core has a first leg, a second leg and a third leg.

7. The RF choke according to claim 6 wherein the wire is wound on the first leg for 2 turns, on the second leg for 3 turns and on the third leg for 2 turns.

8. The RF choke according to claim 6 wherein the core and wire forms a first inductor and the conductor line forms a second inductor, the first and second inductors being series connected.

9. A radio frequency choke comprising:
   a) a substrate having a top surface and a bottom surface;
   b) a first inductor located within the substrate, the inductor having a first and second end;
   c) first top terminal and second top terminal located on the top surface;
   d) first bottom terminal and second bottom terminal located on the bottom surface;
   e) a first via extending through the substrate between the first top terminal and the first bottom terminal;
   f) a second via extending through the substrate between the second top terminal and the first end of the inductor;
   g) a third via extending through the substrate between the second bottom terminal and the second end of the inductor; and
   h) a second inductor attached to the top surface, the second inductor having a core and a wire wound on the core, the wire having a first end connected to the first top terminal and a second end connected to the second top terminal.

10. The choke according to claim 9 wherein the core is attached to the top surface by an adhesive.

11. The choke according to claim 9, wherein the first bottom terminal forms an input port and the second bottom terminal forms an output port.

12. The choke according to claim 9, wherein the core is a binocular core.

13. The choke according to claim 12 wherein the binocular core has a first leg, a second leg, a third leg and two apertures.

14. The choke according to claim 13 wherein the wire is wound on the first leg for 2 turns, on the second leg for 3 turns and on the third leg for 2 turns.

15. The choke according to claim 9 wherein the choke is less than 0.150 inches in length by 0.150 inches in width by 0.150 inches in height.

16. The choke according to claim 9 wherein the first inductor is formed by a conductor line located within the substrate.

17. A choke comprising:
   a) a low temperature co-fired ceramic substrate having a first, second, third, fourth and fifth layer;
   b) first terminal and second terminal located on the first layer;
   c) third terminal and fourth terminal located on the fifth layer;
   d) a first inductor attached to the first layer, the first inductor having a core and a wire wound on the core, the wire having one end attached to the first terminal and the other end attached to the second terminal;
   e) a second inductor located on the second layer, the second inductor having a conductor line, the conductor line having one end attached to the second terminal and another end attached to the fourth terminal;
   f) a first via extending through the substrate between the first terminal and the third terminal;
   g) a second via extending through the substrate between the second terminal and the conductor line; and
   h) a third via extending through the substrate between the fourth terminal and the conductor line.

18. The choke according to claim 17, wherein the third terminal forms an input port and the fourth terminal forms an output port.

19. The choke according to claim 17, wherein the core is a binocular core.

20. The choke according to claim 19 wherein the binocular core has a first leg, a second leg, a third leg and two apertures.

21. The choke according to claim 20 wherein the wire is wound on the first leg for 2 turns, on the second leg for 3 turns and on the third leg for 2 turns.

22. The choke according to claim 17 wherein the choke is less than 0.150 inches in length by 0.150 inches in width by 0.150 inches in height.

* * * * *